(12) United States Patent
Naghshtabrizi et al.

(10) Patent No.: US 10,118,499 B2
(45) Date of Patent: Nov. 6, 2018

(54) DISTANCE UNTIL CHARGE PREDICTION FOR VEHICLES

(71) Applicant: Ford Global Technologies, LLC, Dearborn, MI (US)

(72) Inventors: Payam Naghshtabrizi, Royal Oak, MI (US); Johannes Geir Kristinsson, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 409 days.

(21) Appl. No.: 14/493,836

(22) Filed: Sep. 23, 2014

(65) Prior Publication Data

US 2016/0082857 A1    Mar. 24, 2016

(51) Int. Cl.
*G01R 31/36*  (2006.01)
*B60L 11/18*  (2006.01)
*B60L 15/20*  (2006.01)
*B60L 11/12*  (2006.01)

(52) U.S. Cl.
CPC ......... *B60L 11/1861* (2013.01); *B60L 11/12* (2013.01); *B60L 11/1862* (2013.01); *B60L 15/20* (2013.01); *G01R 31/3648* (2013.01); *B60L 2240/60* (2013.01); *B60L 2260/44* (2013.01); *B60L 2260/52* (2013.01); *G01R 31/3651* (2013.01); *G01R 31/3693* (2013.01); *Y02T 10/7005* (2013.01); *Y02T 10/705* (2013.01); *Y02T 10/7044* (2013.01); *Y02T 10/7077* (2013.01); *Y02T 10/7291* (2013.01); *Y02T 90/161* (2013.01)

(58) Field of Classification Search
CPC .................................................. G06F 17/5009
USPC ................. 701/22, 123, 457; 903/903, 907; 180/65.28, 65.29, 65.265; 320/104
See application file for complete search history.

(56) References Cited

U.S. PATENT DOCUMENTS 7,013,205 B1    3/2006   Hafner et al.
7,849,944 B2 *  12/2010  DeVault ................ B60K 6/365
                                                    180/65.265

(Continued)

OTHER PUBLICATIONS

Online prediction of an electric vehicle remaining range based on regression analysis; Bolovinou, A.; Bakas, I.; Amditis, A.; Mastrandrea, F.; Vinciotti, W.; Electric Vehicle Conference (IEVC), 2014 IEEE International; Year: 2014 pp. 1-8, DOI: 10.1109/IEVC.2014. 7056167.*

(Continued)

*Primary Examiner* — Cuong H Nguyen
(74) *Attorney, Agent, or Firm* — David Kelley; Brooks Kushman P.C.

(57) ABSTRACT

A vehicle includes a traction battery and a controller programmed to, in response to a first ignition cycle after a charging of the traction battery, output a distance until charge prediction based on one or more selected distance estimates from filtered sets of historical data that are derived by filtering historical data based on a time and a day of the first ignition cycle. The selected distance estimates may be from filtered sets having more than a predetermined number of members. The selected distance estimates may be from filtered sets having a variance that is less than an overall historic variance. The filtered sets may include members of an unfiltered set based on a time of day and day of week.

13 Claims, 2 Drawing Sheets

(56) References Cited

U.S. PATENT DOCUMENTS

| | | | | |
|---|---|---|---|---|
| 8,359,133 | B2* | 1/2013 | Yu | B60K 6/445 701/22 |
| 8,543,272 | B2* | 9/2013 | Yu | B60W 50/0097 180/65.265 |
| 8,731,752 | B2* | 5/2014 | Yu | B60W 10/26 180/65.265 |
| 9,102,318 | B2* | 8/2015 | Yu | B60K 6/445 |
| 9,454,902 | B2* | 9/2016 | Kamarianakis | G08G 1/0116 |
| 2006/0284600 | A1 | 12/2006 | Verbrugge | |
| 2007/0112475 | A1* | 5/2007 | Koebler | B60L 3/12 701/1 |
| 2008/0262667 | A1* | 10/2008 | Otabe | B60W 10/06 701/22 |
| 2008/0262668 | A1 | 10/2008 | Yamada | |
| 2009/0114463 | A1* | 5/2009 | DeVault | B60K 6/365 180/65.29 |
| 2010/0138142 | A1 | 6/2010 | Pease | |
| 2010/0332125 | A1* | 12/2010 | Tan | G01C 21/165 701/408 |
| 2011/0087390 | A1* | 4/2011 | Pandit | B60K 1/00 701/22 |
| 2011/0264317 | A1* | 10/2011 | Druenert | B60K 6/48 701/22 |
| 2012/0262125 | A1* | 10/2012 | Fassnacht | B60L 3/0046 320/162 |
| 2012/0290159 | A1* | 11/2012 | McGee | B60K 6/445 701/22 |
| 2013/0179070 | A1* | 7/2013 | Kristinsson | G01C 21/3617 701/467 |
| 2014/0309977 | A1* | 10/2014 | Kamarianakis | G08G 1/0116 703/6 |

OTHER PUBLICATIONS

Crowd sourced energy estimation in connected vehicles; Jayakumar, A.; Ingrosso, F.; Rizzoni, G.; Meyer, J.; Doering, J.; Electric Vehicle Conference (IEVC), 2014 IEEE International; Year: 2014; pp. 1-8, DOI: 10.1109/IEVC.2014.7056189.*

Distance Until Charge prediction and fuel economy impact for Plug-in Hybrid Vehicles; Naghshtabrizi, P.; Kristinsson, J.; Hai Yu; McGee, R.; American Control Conference (ACC), 2011; Year: 2011; pp. 2739-2744, DOI: 10.1109/ACC.2011.5991117.*

Utilizing battery electric and plug-in hybrids for smart grid operation techniques; Agsten; Mike Ifland; Steffen Schlegel; Dirk Westermann; 2011 IEEE Power and Energy Society General Meeting;Year: 2011; pp. 1-5.*

Distance Until Charge prediction and fuel economy impact for Plug-in Hybrid Vehicles; Payam Naghshtabrizi; Johannes Kristinsson; Hai Yu; Ryan McGee; Proceedings of the 2011 American Control Conference; Year: 2011; pp. 2739-2744.*

On predicting vehicle tracks; Xiaowen Gong; Sathiamoorthy Manoharan; Proceedings of 2011 IEEE Pacific Rim Conference on Communications, Computers and Signal Processing; Year: 2011; pp. 31-36.*

Utilizing battery electric and plug-in hybrids for smart grid operation techniques; M. Agsten; Mike Ifland; Steffen Schlegel; Dirk Westermann; 2011 IEEE Power and Energy Society General Meeting; pp. 1-5; Year: 2011.*

Distance Until Charge prediction and fuel economy impact for Plug-in Hybrid Vehicles Payam Naghshtabrizi; Johannes Kristinsson; Hai Yu; Ryan McGee; Proceedings of the 2011 American Control Conference; pp. 2739-2744; Year: 2011.*

Study of the key technologies of V2G-based Pev charging and discharging facilities; Peng Han; Jin-kuan Wang; Ying-hua Han; Yan Li; Proceedings of the 32nd Chinese Control Conference; pp. 8837-8841; Year: 2013.*

* cited by examiner

DISTANCE UNTIL CHARGE PREDICTION FOR VEHICLES

TECHNICAL FIELD

This application generally relates to energy management for vehicles.

BACKGROUND

Plug-in hybrid electric vehicles (PHEVs) utilize energy stored in a traction battery to provide electric-only driving range. A vehicle charging station is used to provide energy to the traction battery. The vehicle charging station provides an interface that couples energy to the traction battery of the vehicle. A typical PHEV may operate in an electric-only mode of operation until the battery state of charge (SOC) becomes less than a threshold. The PHEV may continue operating using engine power and maintaining a battery SOC at a minimum level until the traction battery is recharged.

SUMMARY

A vehicle includes a traction battery and at least one controller programmed to, in response to a first ignition cycle after a charging of the traction battery, output a distance until charge prediction that is based on one or more selected distance estimates from filtered sets of historical data that are derived by filtering historical data based on a time and a day of the first ignition cycle. The selected distance estimates may be from the filtered sets of historical data that have more than a predetermined number of members. The selected distance estimates may be from the filtered sets that have a variance that is less than or equal to an overall historical data variance. The distance until charge prediction may be an average of the selected distance estimates. At least one of the filtered sets may include the historical data associated with a stored time of day that is within a predetermined time range that includes the time of the first ignition cycle. At least one of the filtered sets may include the historical data associated with a stored day of week that matches the day of the first ignition cycle. At least one of the filtered sets may include the historical data associated with a stored day type that matches a day type of the day of the first ignition cycle. At least one of the filtered sets may include the historical data associated with a stored day of week that matches the day of the first ignition cycle and associated with a stored time of day that is within a predetermined time range that includes the time of the first ignition cycle. The distance until charge prediction may be further based on a recursive least squares estimation for each of the filtered sets.

An energy management system for a vehicle includes at least one controller programmed to, in response to a first ignition cycle after a charging event, output a distance until charge prediction based on an average of selected distance estimates from a plurality of filtered sets of historical data, wherein the filtered sets are derived from an unfiltered set according to a day of week and a time of day of the first ignition cycle. The unfiltered set may include a stored time of day, a stored day of week, and corresponding distance between charge values from previous operation of the vehicle. The selected distance estimates may be from filtered sets of historical data that have more than a predetermined number of members. The selected distance estimates may be from filtered sets of historical data that have a variance that is less than a variance of the unfiltered set. The selected distance estimates from the plurality of filtered sets of historical data may be further based on a recursive least squares estimation for each of the filtered sets. At least one of the filtered sets may include those members of the unfiltered set associated with a stored time of day that is within a predetermined amount of the time of day. At least one of the filtered sets includes those members of the unfiltered set associated with a stored day of week that matches the day of week.

A method of operating a traction battery includes outputting, by a controller, a distance until charge prediction that is based on one or more selected distance estimates from filtered sets of historical data, and a day and a time of a first ignition cycle after a charging of the traction battery. The method further includes operating, by the controller, the traction battery according to the distance until charge prediction. The method may further include selecting, by the controller, estimates from filtered sets of historical data based on a number of members in each of the filtered sets and a variance of each of the filtered sets. The filtered sets may include selected members of an unfiltered set that includes a stored time of day, a stored day of week, and an associated distance between charge values from previous vehicle operation. The filtered sets may be derived from the unfiltered set based on the day and the time of the first ignition cycle.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
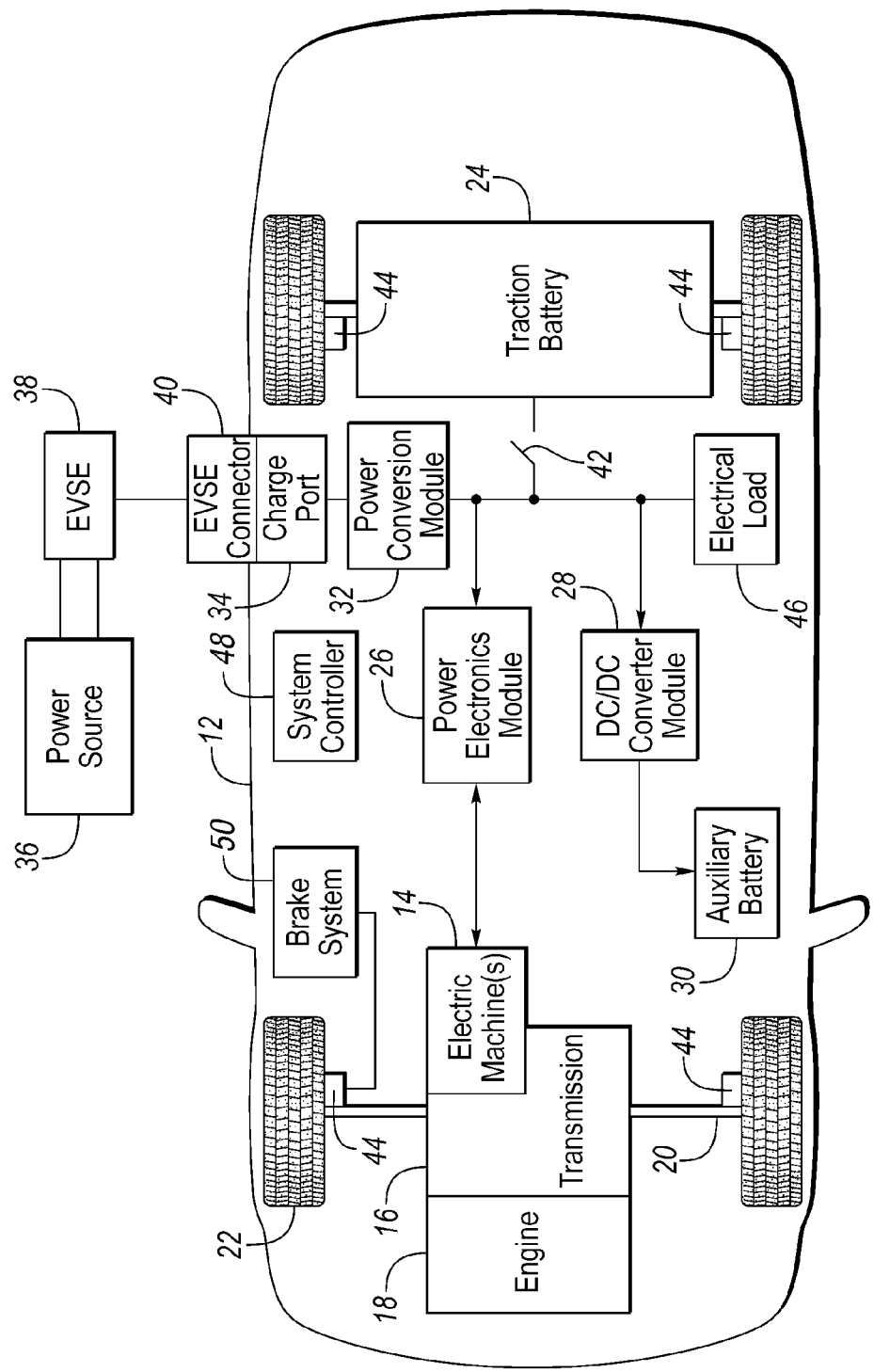
FIG. 1 is a diagram of a hybrid vehicle illustrating typical drivetrain and energy storage components.

FIG. 1 depicts a typical plug-in hybrid-electric vehicle (PHEV). A typical plug-in hybrid-electric vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 also act as generators and can provide fuel economy benefits by recovering energy that would normally be lost as heat in the friction braking system. The electric machines 14 may also reduce vehicle emissions by allowing the engine 18 to operate at more efficient speeds and allowing the hybrid-electric vehicle 12 to be operated in electric mode with the engine 18 off under certain conditions.

A traction battery or battery pack 24 stores energy that can be used by the electric machines 14. A vehicle battery pack 24 typically provides a high voltage DC output. The traction battery 24 is electrically connected to one or more power electronics modules 26. One or more contactors 42 may isolate the traction battery 24 from other components when opened and connect the traction battery 24 to other components when closed. The power electronics module 26 is also electrically connected to the electric machines 14 and provides the ability to bi-directionally transfer energy between the traction battery 24 and the electric machines 14. For example, a typical traction battery 24 may provide a DC voltage while the electric machines 14 may operate using a three-phase AC current. The power electronics module 26 may convert the DC voltage to a three-phase AC current for use by the electric machines 14. In a regenerative mode, the power electronics module 26 may convert the three-phase AC current from the electric machines 14 acting as generators to the DC voltage compatible with the traction battery 24. The description herein is equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical system may include a DC/DC converter module 28 that converts the high voltage DC output of the traction battery 24 to a low voltage DC supply that is compatible with other vehicle loads. Other high-voltage loads 46, such as compressors and electric heaters, may be connected directly to the high-voltage without the use of a DC/DC converter module 28. The low-voltage systems may be electrically connected to an auxiliary battery 30 (e.g., 12V battery).

The vehicle 12 may be an electric vehicle or a plug-in hybrid vehicle in which the traction battery 24 may be recharged by an external power source 36. The external power source 36 may be a connection to an electrical outlet that receives utility power. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically connected may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 for vehicle deceleration. The brake system 50 may respond to driver commands and may also operate autonomously to implement features such as stability control. The controller of the brake system 50 may implement a method of applying a requested brake force when requested by another controller or sub-function.

One or more electrical loads 46 may be connected to the high-voltage bus. The electrical loads 46 may have an associated controller that operates and controls the electrical loads 46 when appropriate. Examples of electrical loads 46 may be a heating module or an air-conditioning module.

The various components discussed may have one or more associated controllers to control and monitor the operation of the components. The controllers may communicate via a serial bus (e.g., Controller Area Network (CAN)) or via discrete conductors. A system controller 48 may be present to coordinate the operation of the various components.

The vehicle may include an odometer that indicates the distance that the vehicle has traveled. The odometer value may be input to the controller. The odometer function may be implemented in one or more of the controllers (e.g., 48). The odometer function may utilize wheel speeds or engine speed to calculate the distance traveled.

The base operating strategy of a PHEV may include a first mode and a second mode of operation. The first mode of operation may be a charge depletion mode. The charge depletion mode may operate the vehicle in a mode that uses energy stored in the traction battery. The vehicle may operate in the charge depleting mode until the battery SOC becomes less than a minimum threshold. The second mode of operation may be a charge sustaining mode. The charge sustaining mode may operate the vehicle using energy from the engine and the traction battery. In the charge sustaining mode, the battery SOC may be maintained at a nearly constant level. The battery SOC may vary in a range about a predetermined SOC level. The typical operating strategy may be described as a period of charge depleting operation followed by a period of charge sustaining operation.

A PHEV may operate in the charge depletion mode after charging the traction battery. The PHEV may transition to the charge sustaining mode when the battery SOC becomes less than the predetermined threshold. Such an operating strategy may not yield optimal fuel economy in cases in which the electric range is less than the distance to be traveled. Knowledge of a distance until the next charge may be used to optimize the operating strategy. For example, it may be known that the distance until the next charge is greater than an electric-only distance. In this case, improved fuel economy may be achieved by adapting a slower battery depletion profile. Such an operating strategy may use alternating periods of charge depletion operation and charge sustaining operation.

The distance until charge (DUC) is generally not known in advance and may be difficult to estimate. Many factors contribute to this estimation difficulty. A vehicle operator may drive different routes having different distances. The vehicle operator may not always charge the vehicle after the distance. The DUC may vary due to many factors. However, strategies may be employed to predict the DUC. An operator may develop specific detectable patterns of charging the vehicle. For example, on a work day, the operator may always leave home with a full battery, drive to work and back, and then charge the vehicle at home.

A set of historical data may be recorded and stored in the non-volatile memory of the controller 48. The historical data may include a time of day (TOD) and a day of week (DOW) that are recorded and stored at the first ignition cycle after charging of the traction battery. A first odometer value at the first ignition cycle may also be stored. When the next charging cycle is initiated, a second odometer value may be recorded and stored. A distance between charge may be calculated as the difference between the second and first odometer values. The distance between charge value may be stored with the associated TOD and DOW of the first ignition cycle for later use. In addition, other historical data may be included in the set. For example, location based data, such as starting or ending locations, may be included.

The historical data may be stored in a data structure within the memory of the controller 48. Each member of the set of historical data may include the time of day, day of week, and the actual DUC value associated with the time of day and day of week.

Figure 2:
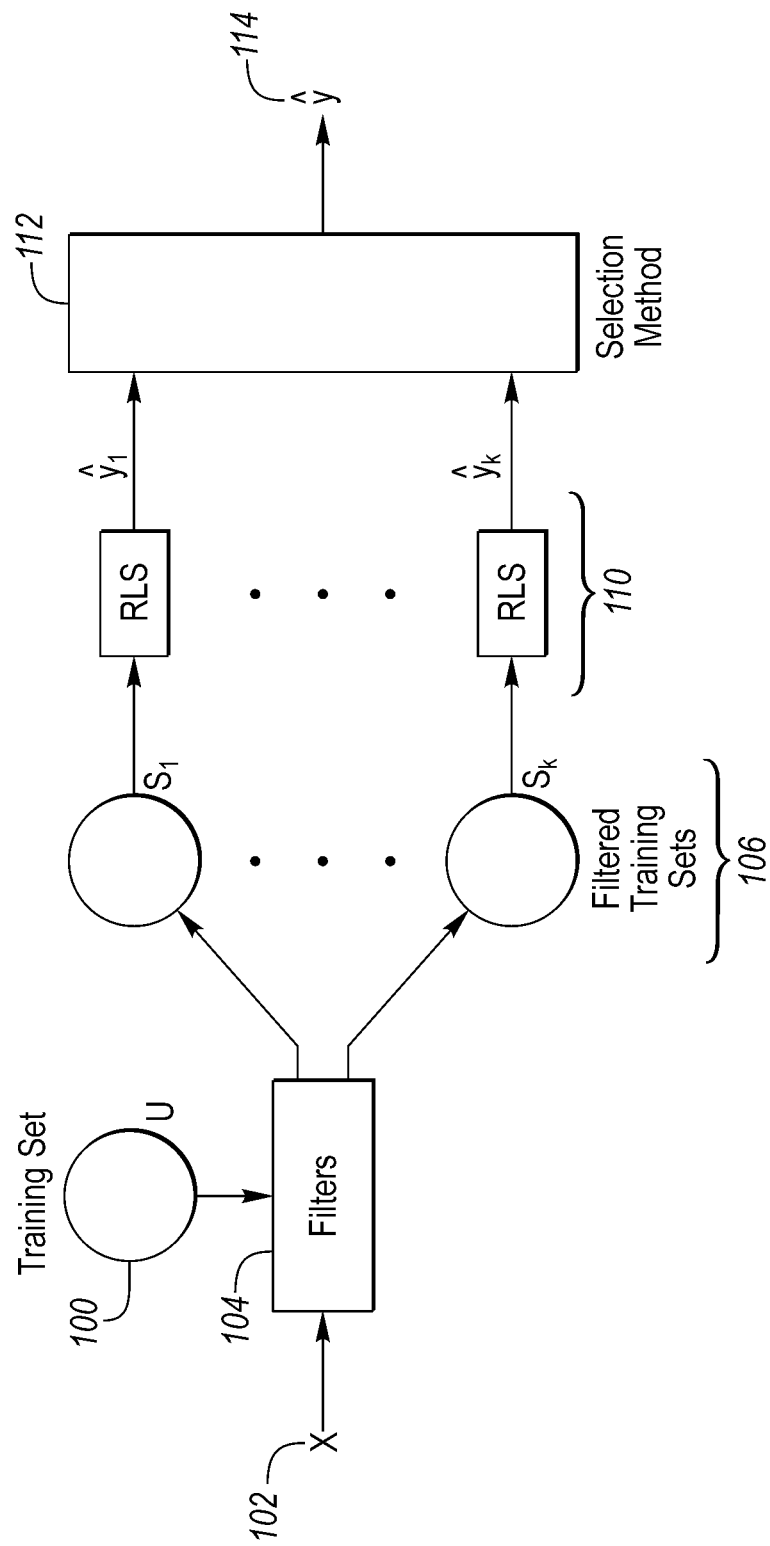
FIG. 2 is a block diagram of a distance until charge estimator.

FIG. 2 is a block diagram of the DUC prediction. A training set 100 may be constructed that includes historical data or past observations. The historical data may include the DOW, the TOD, and the distance between charge. The DOW and TOD may be recorded upon the first ignition cycle after a traction battery charge cycle. The distance between charge may be the distance from the first ignition cycle after charging until the next charge cycle. For example, consider an operator that charges the vehicle at home. The operator may remove the charger and start the vehicle (e.g., initiate an ignition cycle). At the time the vehicle is started, the TOD and DOW may be recorded in non-volatile memory of the controller. The current odometer value may also be recorded. The operator may drive to a destination (e.g., work). At a later time, the operator may drive the vehicle back home and plug in the charger. When the charger is plugged in, the distance traveled since the last charge may be recorded as the difference between the present odometer value and the previously stored odometer value. The difference may be stored as the distance between charge for the associated TOD and DOW.

The data storage process may be repeated each time the charger is removed and an ignition cycle is initiated. Over time, a set of DOW, TOD, and distance between charge values may be accumulated. The training set 100 may include all of the accumulated values.

An input, x 102, may include the present DOW and TOD values. The inputs 102 may be passed through one or more filters 104. The filters 104 may filter the training set 100 according to the inputs 102. The output of the filters 104 may be one or more filtered training sets 106. The filtered training sets 106 may include selected members of the training set 100. For example, a filtered training set (e.g., 106) may include the members from the training set 100 that have the same DOW type, weekend or weekday, that matches the DOW type of the input 102. A filtered training set (e.g., 106) may include members from the training set 100 that have the same DOW as the input 102. A filtered training set 106 may include members from the training set 100 that are within 1.5 hours of the input 102 TOD.

A recursive least squares (RLS) estimation 110 may then be performed on each of the filtered training sets 106. The RLS estimation 110 performs numerical operations on the filtered training sets 106 and provides an estimate of the DUC for each of the filtered training sets 106.

For each of the filtered set DUC estimates, a Quality of Prediction (QoP) may be calculated. The QoP may be based on several factors. The variance of the filtered training set 106 may be a factor. A filtered training set 106 with a high variance may be indicative of high variability and randomness. Using the filtered training set 106 with a high variance may not yield an accurate prediction. A filtered training set 106 having variance above a predetermined value may be excluded from the final DUC prediction.

The variance threshold value may be selected as a fixed value. The variance threshold may also be selected as the variance of the unfiltered training set 100 as the normal variance of the data. A filtered training set 106 may be excluded if the filtered training set variance is greater than the variance of the unfiltered training set 100. This approach may be useful for drivers that exhibit a more random driving pattern. Also, the variable threshold may be simpler to implement as a fixed level for the threshold does not have to be calculated and entered.

Another factor may be the number of samples in the filtered training set 106. A filtered training set 106 having only one data sample may have a variance of zero. However, such a set may be unreliable as there is only one sample. A filtered training set 106 having less than a predetermined number of samples (e.g., three samples) may be considered to be a low QoP and may be excluded from the final DUC prediction.

It is possible that some of the filtered training sets 106 have a low QoP value. Other filtered training sets 106 may have a high QoP value. In order to improve the final DUC prediction, only the filtered training sets having a QoP greater than a predetermined value (e.g., a "high" QoP) may be used in the prediction. Filtered training sets having a QoP value that is less than the predetermined value may be excluded from the prediction.

Over time, the training set 100 will be populated with samples. The samples may include the TOD, DOW, and distance between charge for each charge/deplete cycle that has occurred. A new prediction cycle may be initiated when the charger is removed and the ignition is cycled. On the first ignition cycle after charge, the TOD and DOW may be recorded. The TOD and DOW may be used to generate the filtered training sets 106. The training set 100 may be filtered to select those members that match the filtered training set criteria. For example, the filtered training set 106 may select those members of the training set 100 having approximately the same TOD and DOW values as the present TOD and DOW. A number of filtered training sets 106 may be generated, each having different selection criteria.

For example, there may be four filtered training sets 106, $S_1$, $S_2$, $S_3$, and $S_4$. The input 102, x, may be the TOD and DOW corresponding to the first ignition cycle after charging. An unfiltered training set 100, U, may be comprised of historical data members that include corresponding TOD, DOW, and distance between charge values. During the first ignition cycle after charging, the filtered training sets 106 may be derived from the unfiltered training set 100, U. Each of the filtered training sets 106 may have different selection criteria.

For example, filtered set, $S_1$, may include the members from the training set 100, U, that have the same DOW type (e.g., weekend or weekday) that matches the DOW type of the input 102, x. Other definitions for DOW type are possible, such as workday or non-workday. Filtered training set, $S_2$, may include members from the training set 100, U, that have the same DOW as the input 102, x. Filtered training set, $S_3$, may include members from the training set 100, U, that are within a predetermined time range (e.g., 1.5 hours) that includes the TOD element of input 102, x. Filtered training set, $S_4$, may include members of the unfiltered training set 100 that are in both sets $S_2$ and $S_3$. More data sets may be defined using similar criteria based on the input 102, x.

The estimators may utilize a Recursive Least Squares (RLS) estimation 110 method to calculate a DUC prediction from the historical data. Each of the filtered data sets 106 may be operated on by the RLS estimation 110 to generate a distance until charge estimate for each of the filtered sets 106.

A selection process 112 may be implemented to select the filtered data set DUC values to use in the final DUC estimate. The selection process 112 may generate a QoP value for each of the filtered sets 106.

A QoP for each of the filtered data sets 106 may be determined. If the QoP is greater than a predetermined value, then the filtered data set 106 may be included in the final DUC prediction. For example, an inclusion parameter, $\eta_k$, may be defined for each of the k filtered data sets 106. The inclusion parameter may be based on the number of samples or members in the filtered data set 106. The inclusion parameter may be calculated as follows:

$$\eta_k = \begin{cases} 0, & n_k \leq 3 \\ 1, & \text{otherwise} \end{cases} \quad (1)$$

where $n_k$ is the number of samples in filtered data set k. When the inclusion parameter, $\eta_k$, is zero, the corresponding prediction is discarded and is not used in the final DUC prediction.

Additional criteria for the inclusion parameters may be checked. A check based on the variance of the filtered data set 106 may be included. The unfiltered data set variance, $\sigma_u$, may be calculated. The filtered data set variance, $\sigma_k$, may be calculated for each of the filtered data sets 106. The inclusion parameter, $\eta_k$, may be set to zero when $\sigma_k \geq \sigma_u$.

The final DUC prediction 114 may be the average of the filtered data set predictions having a QoP above a predetermined value. Alternatively, the final DUC prediction 114 includes the predictions of those filtered data sets 106 having an inclusion parameter of one. This may be expressed as:

$$\hat{y} = \begin{cases} \dfrac{\sum_k \eta_k \hat{y}_k}{\sum_k \eta_k}, & \sum_k \eta_k > 2 \\ \text{no estimation}, & \text{otherwise} \end{cases} \quad (2)$$

Note that the system may not generate a final DUC prediction 114 if the result is not likely to be accurate.

The final predicted DUC may be an average of all of the predicted DUC values. The average may include only those DUC estimates that have a QoP that is greater than a predetermined threshold (normal QoP). If none of the DUC estimates have a sufficient QoP, then no final predicted DUC may be provided. The final predicted DUC may be used in an energy management system to determine a traction battery depletion profile.

The DUC prediction may be performed by a controller (e.g., 48) and may be part of an energy management system. The energy management system may operate the traction battery according to the DUC prediction. The energy management system may control the charging and discharging of the traction battery.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A vehicle comprising:
a traction battery; and
a controller programmed to, in response to a first ignition cycle after a charging of the traction battery, output a distance until charge prediction that is based on a plurality of distance estimates from filtered sets of historical distance until charge data having a variance less than a threshold and having members selected according to a time and a day of the first ignition cycle.

2. The vehicle of claim 1 wherein the at least one controller is further programmed to select distance estimates from filtered sets of historical data that have more than a predetermined number of members.

3. The vehicle of claim 1 wherein the at least one controller is further programmed to select distance estimates from filtered sets that have a variance that is less than or equal to an overall historical data variance for each of the filtered sets.

4. The vehicle of claim 1 wherein the distance until charge prediction is an average of the distance estimates.

5. The vehicle of claim 1 wherein at least one of the filtered sets includes the historical data associated with a stored time of day that is within a predetermined time range that includes the time of the first ignition cycle.

6. The vehicle of claim 1 wherein at least one of the filtered sets includes the historical data associated with a stored day of week that matches the day of the first ignition cycle.

7. The vehicle of claim 1 wherein at least one of the filtered sets includes the historical data associated with a stored day type that matches a day type of the day of the first ignition cycle.

8. The vehicle of claim 1 wherein at least one of the filtered sets includes the historical data associated with a stored day of week that matches the day of the first ignition cycle and associated with a stored time of day that is within a predetermined time range that includes the time of the first ignition cycle.

9. The vehicle of claim 1 wherein the distance until charge prediction is further based on a recursive least squares estimation for each of the filtered sets.

10. A method comprising:
selecting, by a controller, distance estimates from filtered sets of historical data based on a variance of each of the filtered sets; and
operating, by the controller, a hybrid vehicle powertrain according to a battery operating mode selected according to a distance until charge prediction that is based on an average of the distance estimates, and a day and a time of a first ignition cycle after charging a traction battery.

11. The method of claim 10 further comprising selecting, by the controller, estimates from filtered sets of historical data further based on a number of members in each of the filtered sets.

12. The method of claim 10 wherein the filtered sets include selected members of an unfiltered set that includes a stored time of day, a stored day of week, and an associated distance between charge values from previous vehicle operation.

13. The method of claim 12 wherein the filtered sets are derived from the unfiltered set based on the day and the time of the first ignition cycle.

* * * * *